(12) United States Patent
Hirakawa (10) Patent No.: US 8,968,005 B2
(45) Date of Patent: Mar. 3, 2015

(54) CIRCUIT-TERMINAL CONNECTING DEVICE

(71) Applicant: Dai-Ichi Seiko Co., Ltd., Kyoto (JP)

(72) Inventor: Takeshi Hirakawa, Tokyo (JP)

(73) Assignee: Dai-Ichi Seiko Co., Ltd., Kyoto (JP)

( * ) Notice: Subject to any disclaimer, the term of this patent is extended or adjusted under 35 U.S.C. 154(b) by 188 days.

(21) Appl. No.: 13/671,362

(22) Filed: Nov. 7, 2012

(65) Prior Publication Data

US 2013/0137281 A1     May 30, 2013

(30) Foreign Application Priority Data

Nov. 30, 2011 (JP) ................................. 2011-261517

(51) Int. Cl.
*H01R 12/00*     (2006.01)
(52) U.S. Cl.
USPC ............................................................. 439/65
(58) Field of Classification Search
USPC ............ 439/65.66, 67, 68, 73, 74, 77, 78, 80, 439/82, 660, 284, 295, 330
See application file for complete search history.

(56) References Cited

U.S. PATENT DOCUMENTS

| | | | | |
|---|---|---|---|---|
| 5,199,884 | A * | 4/1993 | Kaufman et al. | 439/74 |
| 5,876,217 | A * | 3/1999 | Ito et al. | 439/74 |
| 6,287,130 | B1 * | 9/2001 | Torii | 439/83 |
| 7,789,677 | B2 * | 9/2010 | Yang et al. | 439/83 |
| 2004/0063344 | A1 * | 4/2004 | Shin | 439/74 |
| 2011/0059634 | A1 * | 3/2011 | Chen | 439/83 |

FOREIGN PATENT DOCUMENTS

| | | |
|---|---|---|
| JP | H9-312183 A | 12/1997 |
| JP | 2007-258001 A | 10/2007 |

* cited by examiner

*Primary Examiner* — Abdullah Riyami
*Assistant Examiner* — Harshad Patel
(74) *Attorney, Agent, or Firm* — Studebaker & Brackett PC (57) ABSTRACT

A circuit-terminal connecting device comprising a first connector having a first housing fixed to a main circuit board and first contacts supported by the first housing to be connected with first circuit-terminals provided on the main circuit board and a second connector having a second housing attached to a flat circuit member and second contacts supported by the second housing to be connected with second circuit-terminals provided on the flat circuit member. The first housing of the first connector fits into a hole formed in the second housing of the second connector so as to create an electrical piling connection between the main circuit board and the flat circuit member wherein the flat circuit member is laid on top of the main circuit board and the first circuit-terminals are electrically connected with the second circuit-terminals through the first and second connectors.

7 Claims, 9 Drawing Sheets

CIRCUIT-TERMINAL CONNECTING DEVICE

BACKGROUND OF THE INVENTION

1. Field of the Invention

The present invention relates generally to a circuit-terminal connecting device, and more particularly to an improvement in a circuit-terminal connecting device used for connecting first circuit-terminals provided on a mail circuit board with second circuit-terminals provided on a flat circuit member, such as a flexible printed circuit board (hereinafter, referred to as an FPC), which is laid on top of the main circuit board.

2. Description of the Prior Art Including Information Disclosed Under 37 CFR 1.97 and 37 CFR 1.98

There has been proposed, for the purpose of saving a space in an electronic apparatus, to lay a flat circuit member, such as a relatively small-sized FPC, on top of a main circuit board on which various electrical or electronic parts are mounted when the flat circuit member is electrically connected with the main circuit board in the electronic apparatus. Such an electrical connection between the main circuit board and the flat circuit member wherein the flat circuit member is laid on top of the main circuit board is hereinafter referred to as an electrical piling connection.

There has been also proposed a board connecting device comprising a first connector fixed to a main circuit board, on top of which an FPC is laid, and a second connector fixed to an FPC to be coupled with the first connector when the main circuit board and the FPC are put in an electrical piling connection, as disclosed in, for example, the Japanese patent application published before examination under publication number HEI 9-312183 (hereinafter, referred to as a published prior art document 1) or the Japanese patent application published before examination under publication number 2007-258001 (hereinafter, referred to as a published prior art document 2). With the second connector coupled with the first connector, a plurality of first circuit-terminals provided on the main circuit board are connected respectively with a plurality of second circuit-terminal provided on the FPC through the first and second connectors.

In the board connecting device disclosed in the published prior art document 1, a first connector (a mate connector (110)) having a plurality of contacts (112) is caused to stand on a main circuit board (a printed circuit board (2)) having a plurality of first circuit-terminals (land patterns) provided thereon in such a manner that the contacts of the first connector are soldered respectively to the first circuit-terminals on the main circuit board, and a second connector (a printed circuit board connector (10)) having insulated base-housing (20) and an insulated cover-housing (30) provided for engaging with the first connector is fixed to a FPC (a flexible board (1)) having a plurality of second circuit-terminals (terminals (1b)) arranged in parallel with one another thereon. The FPC is bent along an arrangement of the second circuit-terminals to be held between the insulated base-housing and the insulated cover-housing so that the second circuit-terminals are exposed to the outside on the insulated base-housing.

The FPC to which the second connector is fixed is caused to face and approach to the main circuit board on which the first connector is caused to stand in such a manner that the second connector is positioned to correspond to the first connector. Then, the second connector fixed to the FPC is coupled with the first connector on the main circuit board so that the second circuit-terminals, which are exposed to the outside on the insulated base-housing of the second connector, come directly into contact respectively with the contacts of the first connector to be connected with the same. Therefore, the main circuit board and the FPC are electrically connected with each other in the form of the electrical piling connection, and the second circuit-terminals on the FPC are connected respectively with the first circuit-terminals on the main circuit board through the first and second connectors.

With the board connecting device disclosed in the published prior art document 1 as mentioned above, the second connector fixed to the FPC can be designed without any contact provided thereon for electrical connection with the first connector on the main circuit board.

Further, in the board connecting device disclosed in the published prior art document 2, a first connector (a mate connector (30)) having a plurality of terminals (34) is fixed to a main circuit board (a circuit board (P)) having a plurality of first circuit-terminals (corresponding circuit portions) provided thereon in such a manner that the terminals of the first connector are soldered respectively to the first circuit-terminals on the main circuit board, and a second connector (a connector (10)) having a plurality of terminals (12) is fixed to an FPC (a flexible board (F)) having a plurality of second circuit-terminals (corresponding circuit portions) provided thereon in such a manner that the terminals of the second connector are soldered respectively to the second circuit-terminals on the FPC. On an outer surface of the first connector, a plurality of contacting portions (35) of the terminals of the first connector are arranged to be exposed to the outside. The second connector is provided with a hole (14) formed thereon so that the first connector fixed to the main circuit board fits into the hole on the second connector fixed to the FPC. Around the hole provided on the second connector, a plurality of contacting portions (12B1) of the terminals of the second connector are arranged to be exposed to the hole. One of mutually opposite openings of the hole on the second connector fixed to the FPC is covered closely by the FPC.

The FPC to which the second connector is fixed is caused to face and approach to the main circuit board to which the first connector is fixed in such a manner that the hole provided on the second connector is positioned to correspond to the first connector. Then, the first connector fixed to the main circuit board is caused to fit into the hole provided on the second connector fixed to the FPC so that the second connector is coupled with the first connector, and the contacting portions of the terminals of the second connector, which are arranged around the hole provided on the second connector to be exposed to the hole, come directly into contact respectively with the contacting portions of the terminals of the first connector, which are arranged on the outer surface of the first connector to be exposed to the outside, to be connected with the same. Therefore, the main circuit board and the FPC are electrically connected with each other in the form of the electrical piling connection, and the first circuit-terminals on the main circuit board are connected respectively with the second circuit-terminals on the FPC through the first and second connectors.

When the main circuit board and the FPC are put in the electrical piling connection with the previously proposed board connecting device disclosed in the published prior art document 1 and the first circuit-terminals on the main circuit board are connected respectively with the second circuit-terminals on the FPC, the second connector fixed to the FPC is laid on top of the first connector caused to stand on the main circuit board. Thereby, a distance between the main circuit board and the FPC is made relatively large so that it is undesirably impeded to reduce a thickness of a structure on the whole comprising the main circuit board, the first connector, the second connector and the FPC.

Further, when the FPC to which the second connector is fixed is caused to face and approach to the main circuit board on which the first connector is caused to stand and then connected electrically with the main circuit board so that the main circuit board and the FPC are put in the electrical piling connection, both of the first connector on the main circuit board and the second connector fixed to the FPC are covered by the FPC so as not to be observed from the rear side of the FPC. Accordingly, a handling operation for coupling correctly the second connector fixed to the FPC with the first connector on the main circuit board so as to put the main circuit board and the FPC in the electrical piling connection becomes awkward and it is difficult to confirm visually a condition wherein the main circuit board and the FPC are surely put in the electrical piling connection.

Besides, the board connecting device disclosed in the published prior art document 1 is not provided with any means for locking the second connector coupled with the first connector on the main circuit board and therefore there is a disadvantage that it is difficult for the subject board connecting device to maintain the electrical piling connection between the mail circuit board and the FPC to be stable.

In the previously proposed board connecting device disclosed in the published prior art document 2, the hole into which the first connector fixed to the main circuit board fits are formed on the second connector fixed to the FPC and thereby the second connector fixed to the FPC is not laid on top of the first connector fixed to the main circuit board when the main circuit board and the FPC are put in the electrical piling connection with the board connecting device disclosed in the published prior art document 1. Accordingly, it is possible for the board connecting device disclosed in the published prior art document 1 to make a distance between the main circuit board and the FPC relatively small so as to avoid a situation wherein reduction in a thickness of a structure on the whole comprising the main circuit board, the first connector, the second connector and the FPC is undesirably impeded.

However, in the case of the board connecting device disclosed in the published prior art document 1 also, when the FPC to which the second connector is fixed is caused to face and approach to the main circuit board to which the first connector is fixed and then connected electrically with the main circuit board so that the main circuit board and the FPC are put in the electrical piling connection, both of the first connector fixed to the main circuit board and the second connector fixed to the FPC are covered by the FPC so as not to be observed from the rear side of the FPC. Consequently, a handling operation for coupling correctly the second connector fixed to the FPC with the first connector fixed to the main circuit board so as to put the main circuit board and the FPC in the electrical piling connection becomes awkward and it is difficult to confirm visually a condition wherein the main circuit board and the FPC are surely put in the electrical piling connection.

Further, the board connecting device disclosed in the published prior art document 2 is not provided with any means for locking the second connector coupled with the first connector on the main circuit board and therefore there is an disadvantage that it is difficult for the subject board connecting device to maintain the electrical piling connection between the mail circuit board and the FPC to be stable, in the same manner as the case of the board connecting device disclosed in the published prior art document 1.

BRIEF SUMMARY OF THE INVENTION

Accordingly, it is an object of the present invention to provide a circuit-terminal connecting device which is used for putting a main circuit board and a flat circuit member, such as an FPC, in an electrical piling connection so as to connect electrically first circuit-terminals provided on the mail circuit board with second circuit-terminals provided on the flat circuit member which is laid on top of the main circuit board, and which avoids the aforementioned problems and disadvantages encountered with the prior art.

Another object of the present invention is to provide a circuit-terminal connecting device which is used for putting a main circuit board and a flat circuit member, such as an FPC, in an electrical piling connection so as to connect electrically first circuit-terminals provided on the mail circuit board with second circuit-terminals provided on the flat circuit member which is laid on top of the main circuit board, and with which a thickness of a structure on the whole including the main circuit board and the flat circuit member laid on top of the main circuit board can be effectively reduced.

A further object of the present invention is to provide a circuit-terminal connecting device which is used for putting a main circuit board and a flat circuit member, such as an FPC, in an electrical piling connection so as to connect electrically first circuit-terminals provided on the mail circuit board with second circuit-terminals provided on the flat circuit member which is laid on top of the main circuit board, and with which the electrical piling connection between the main circuit board and the flat circuit member can be surely created by a handling operation superior in practice.

A further object of the present invention is to provide a circuit-terminal connecting device which is used for putting a main circuit board and a flat circuit member, such as an FPC, in an electrical piling connection so as to connect electrically first circuit-terminals provided on the mail circuit board with second circuit-terminals provided on the flat circuit member which is laid on top of the main circuit board, and with which a condition wherein the main circuit board and the flat circuit member are surely put in the electrical piling connection can be confirmed easily and visually.

A still further object of the present invention is to provide a circuit-terminal connecting device which is used for putting a main circuit board and a flat circuit member, such as an FPC, in an electrical piling connection so as to connect electrically first circuit-terminals provided on the mail circuit board with second circuit-terminals provided on the flat circuit member which is laid on top of the main circuit board, and with which the electrical piling connection between the main circuit board and the flat circuit member can be surely maintained to be stable.

According to the present invention, there is provided a circuit-terminal connecting device which comprises a first connector having a first insulating housing fixed to a main circuit board and a plurality of first contacts, each of which is supported by the first insulating housing to have a board-connecting portion operative to be connected with a corresponding one of first circuit-terminals provided on the main circuit board, and a second connector having a second insulating housing attached to a flat circuit member and provided with an engaging portion for engaging with the first connector and a plurality of second contacts, each of which is supported by the second insulating housing to have a terminal-connecting portion operative to be connected with a corresponding one of second circuit-terminals provided on the flat circuit member. The second insulating housing of the second connector is fixed to a hole-forming portion of the flat circuit member with the engaging portion thereof fitting into an engaging hole formed in the hole-forming portion. The engaging portion of the second insulating housing of the second connector forms a hole therein into which the first insulating housing of the first connector fits. Each of the first contacts of the first connector is provided with a contact-engaging portion extending from an outer surface of the first insulating housing of the first connector to the outside of the same. Each of the second contacts of the second connector is provided with a contact-connecting portion positioned to face to the hole formed in the second insulating housing of the second connector. Under such a situation, when the first insulating housing of the first connector fits into the hole formed in the second insulating housing of the second connector, the contact-connecting portion of the second contact of the second connector comes into contact with the contact-engaging portion of the first contact of the first connector to be connected with the same, so that the first circuit-terminals provided on the main circuit board are electrically connected respectively with the second circuit-terminals provided on the flat circuit member through the first and second contacts.

In an embodiment of circuit-terminal connecting device according to the present invention, the first connector is provided with a locking projection which is operative to lock the second connector under a condition wherein the first insulating housing of the first connector fits into the hole formed in the second insulating housing of the second connector. The locking projection of the first connector projects from a portion of the first connector, which is positioned in the hole formed in the second insulating housing of the second connector when the first insulating housing of the first connector fits into the hole, to engage with a receiving portion formed on a part of the engaging portion of the second insulating housing of the second connector and thereby to lock the second connector.

In the circuit-terminal connecting device thus constituted in accordance with the present invention, the flat circuit member, such as an FPC, for example, having the hole-forming portion to which the second insulating housing of the second connector is fixed in such a manner as to fit into the engaging hole formed in the hole-forming portion, is caused to face the main circuit board to which the first insulating housing of the first connector is fixed and then to come close to the main circuit board so that the first insulating housing of the first connector fits into the hole formed in the engaging portion of the second insulating housing of the second connector. At that time, the first insulating housing of the first connector penetrates both of the hole formed in the engaging portion of the second insulating housing of the second connector and the engaging hole formed in the hole-forming portion of the flat circuit member. Then, under the condition wherein each of the second contacts of the second connector has the terminal-connecting portion operative to be connected with the second circuit-terminal provided on the flat circuit member and the contact-engaging portion positioned to face to the hole formed in the engaging portion of the second insulating housing of the second connector, and each of the first contacts of the first connector has the board-connecting portion operative to be connected with the first circuit-terminals provided on the main circuit board and the contact-connecting portion extending from the outer surface of the first insulating housing of the first connector to the outside of the same, the contact-connecting portion of each of the second contacts of the second connector comes into contact with the contact-engaging portion of each of the first contacts of the first connector to be connected with the same. Thereby, the first contacts of the first connector are connected respectively with the second contacts of the second connector so that the first circuit-terminals provided on the main circuit board are connected respectively with the second circuit-terminals provided on the flat circuit member through the first and second connectors. As a result, the main circuit board and the flat circuit member are put in the electrical piling connection wherein each of the first circuit-terminals provided on the main circuit board is electrically connected with one of the second circuit-terminals provided on the flat circuit member.

When the flat circuit member is caused to face the main circuit board for coming close to the same, the first insulating housing of the first connector fixed to the main circuit board can be visually observed through the engaging hole formed in the hole-forming portion of the flat circuit member and the hole formed in the engaging portion of the second insulating housing of the second connector. That is, the first insulating housing of the first connector can be caused to fit into the hole formed in the engaging portion of the second insulating housing of the second connector with a direct visual observation on both of the first insulating housing of the first connector fixed to the main circuit board and the hole formed in the engaging portion of the second insulating housing of the second connector.

Especially, in one embodiment of circuit-terminal connecting device according to the present invention, the locking projection of the first connector is operative to project from the hole formed in the engaging portion of the second insulating housing of the second connector so as to engage with the receiving portion formed on the engaging portion of the second insulating housing of the second connector and thereby to lock the second connector when the first insulating housing of the first connector fixed to the main circuit board is caused to fit into the hole formed in the engaging portion of the second insulating housing of the second connector.

With the circuit terminal connecting device according to the present invention, since the electrical piling connection between the main circuit board and the flat circuit member wherein the first circuit-terminals provided on the main circuit board are electrically connected respectively with the second circuit-terminals provided on the flat circuit member is created by causing the first insulating housing of the first connector fixed to the main circuit board to fit into the hole formed in the engaging portion of the second insulating housing of the second connector attached to the flat circuit member, a thickness of a structure on the whole including the main circuit board to which the first insulating housing of the first connector is fixed and the flat circuit member on which the second insulating housing of the second connector is placed and which is laid on top of the main circuit board can be effectively reduced.

Further, since the first insulating housing of the first connector fixed to the main circuit board is able to be visually observed through the engaging hole formed in the hole-forming portion of the flat circuit member and the hole formed in the engaging portion of the second insulating housing of the second connector when the flat circuit member is caused to face the main circuit board for coming close to the same so as to create the electrical piling connection between the main circuit board and the flat circuit member wherein the first circuit-terminals provided on the main circuit board are electrically connected respectively with the second circuit-terminals provided on the flat circuit member, the first insulating housing of the first connector can be caused to fit into the hole formed in the engaging portion of the second insulating housing of the second connector with the direct visual observation on both of the first insulating housing of the first connector fixed to the main circuit board and the hole formed in the engaging portion of the second insulating housing of the second connector. As a result, the electrical piling connection between the main circuit board and the flat circuit member can be surely created by a handling operation superior in practice and, in addition, a condition wherein the main circuit board and the flat circuit member are surely put in the electrical piling connection can be confirmed easily and visually.

Besides, with one embodiment of circuit-terminal connecting device according to the present invention, since the locking projection of the first connector is operative to project from the hole formed in the engaging portion of the second insulating housing of the second connector so as to engage with the receiving portion formed on the engaging portion of the second insulating housing of the second connector and thereby to lock the second connector when the first insulating housing of the first connector fixed to the main circuit board is caused to fit into the hole formed in the engaging portion of the second insulating housing of the second connector, the electrical piling connection between the main circuit board and the flat circuit member can be surely maintained to be stable.

The above, and other objects, features and advantages of the present invention will become apparent from the following detailed description taken in conjunction with the accompanying drawings.

DETAILED DESCRIPTION OF THE INVENTION

Figure 1:
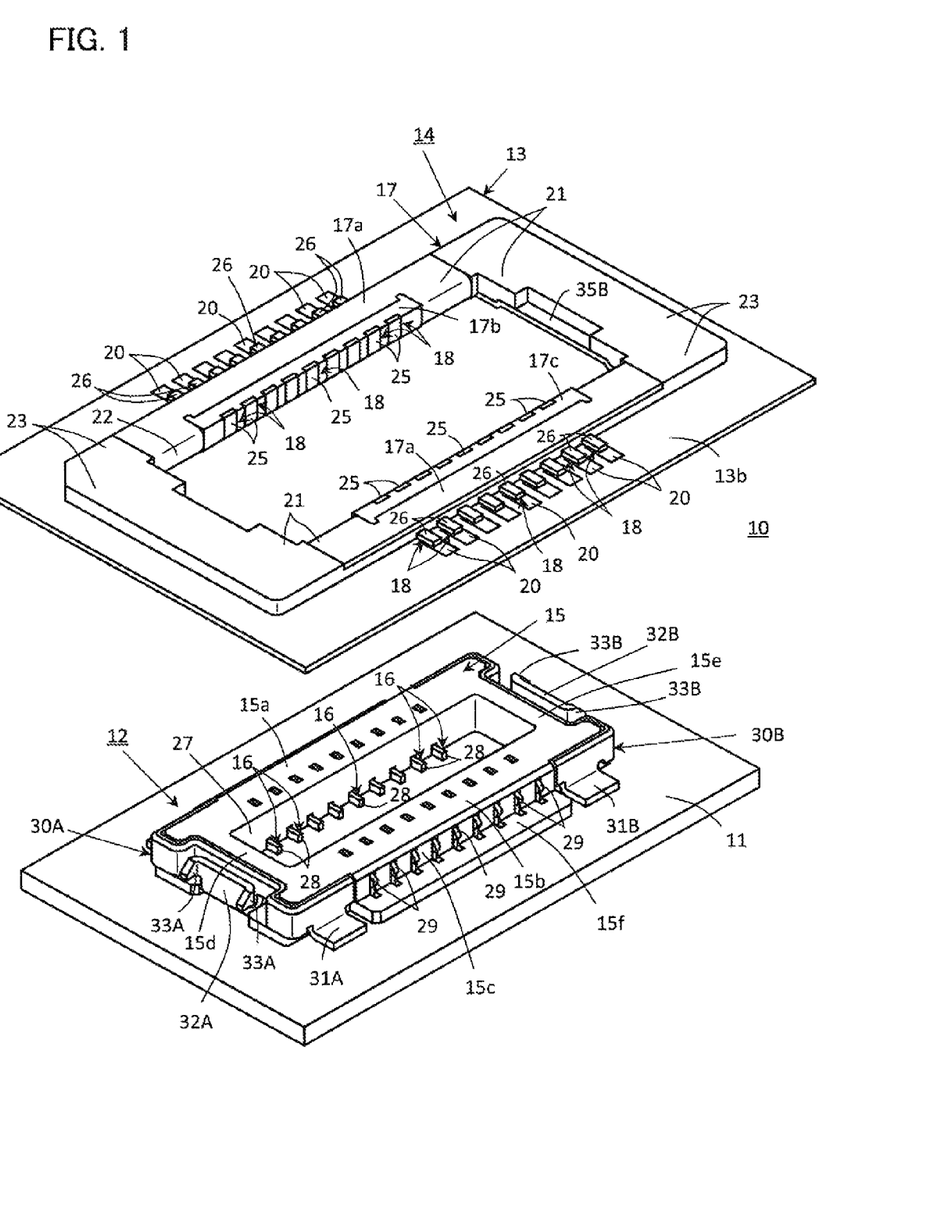
FIG. 1 is a schematic perspective view showing a first embodiment of circuit-terminal connecting device which comprises a first connector having an insulating housing fixed to a main circuit board and a second connector having an insulating housing attached to a flat circuit member.

FIG. 1 shows a first embodiment of circuit-terminal connecting device according to the present invention.

Referring to FIG. 1, a circuit-terminal connecting device 10, which constitutes the first embodiment of circuit-terminal connecting device according to the present invention, comprises a first connector 12 provided on a main circuit board 11 and a second connector 14 accompanied with a flat circuit member 13, such as an FPC, and provided to be coupled with the first connector 12. The first connector 12 has an insulating housing 15 fixed to the main circuit board 11 and a plurality of contact 16 supported by the insulating housing 15. The second connector 14 has an insulating housing 17 attached to the flat circuit member 13 and a plurality of contact 18 supported by the insulating housing 17.

Figure 2:
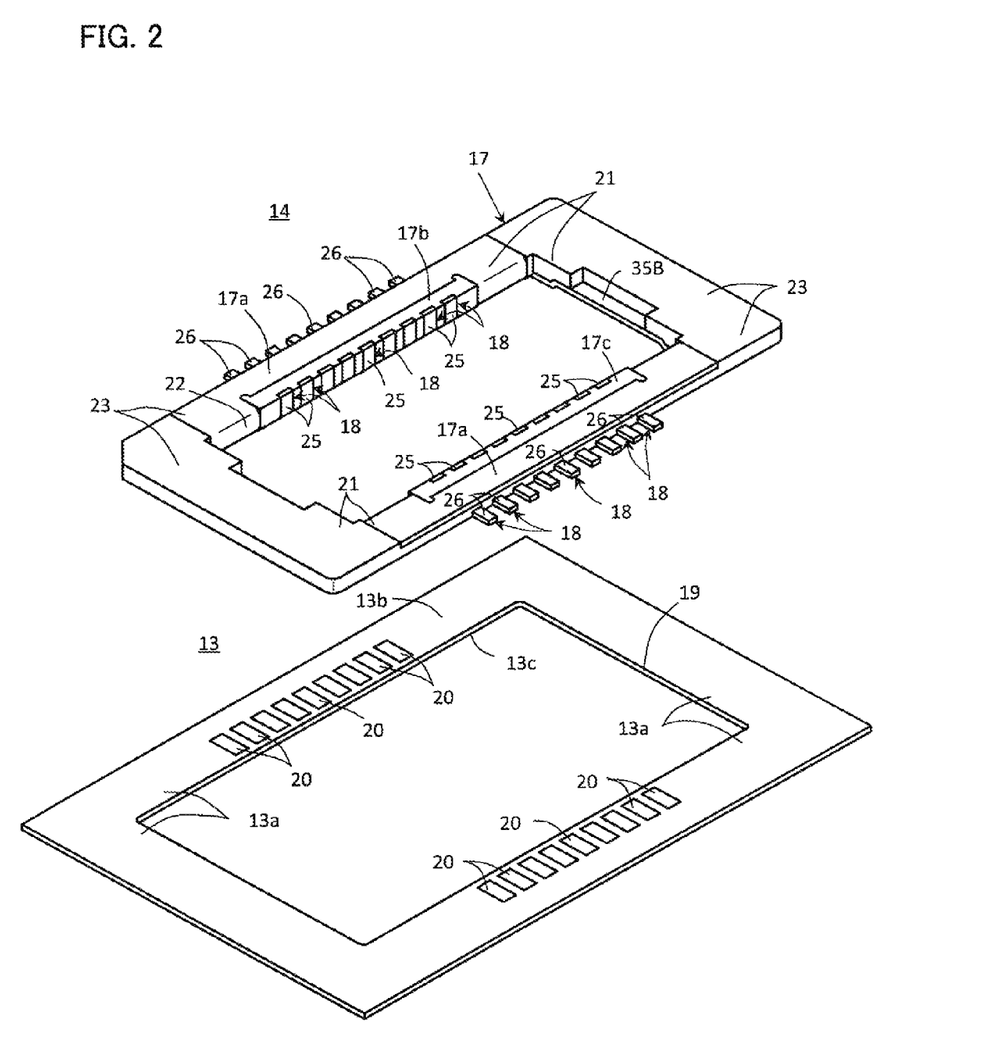
FIG. 2 is a schematic perspective view showing the flat circuit member and the second connector shown in FIG. 1.

As shown in FIG. 2, the flat circuit member 13 is formed into a flat rectangular frame having at an inner side thereof an annular hole-forming portion 13a in which an engaging hole 19 is formed. Further, the flat circuit member 13 is provided with a pair of flat surfaces 13b and 13c opposite to each other and a plurality of circuit-terminals 20 are arranged on the flat surface 13b to be positioned in the vicinity of the engaging hole 19 formed in the annular hole-forming portion 13a. Although illustrations are omitted, various electrical or electronic parts and wiring conductors for connecting the parts with one another are mounted on at least one of the flat surfaces 13b and 13c of the flat circuit member 13.

The insulating housing 17 of the second connector 14 is provided with an annular engaging portion 21 for engaging with the first connector 12 having the insulating housing 15 fixed to the main circuit board 11. In the annular engaging portion 21 of the insulating housing 17 of the second connector 14, a hole 22 is formed so that the insulating housing 15 of the first connector 12 fits into the hole 22 when the second connector 14 is coupled with the first connector 12. Therefore, the insulating housing 17 of the second connector 14 is also formed into a flat rectangular frame having at an inner side thereof the annular engaging portion 21 and at an outer side thereof an annular outside edge portion 23 surrounding the annular engaging portion 21.

For the sake of convenience, hereinafter, the upper side of figures shown in FIG. 2 is referred to as an upper side in relation to the second connector 14 and the lower side of figures shown in FIG. 2 is referred to as a lower side in relation to the second connector 14.

Figure 3:
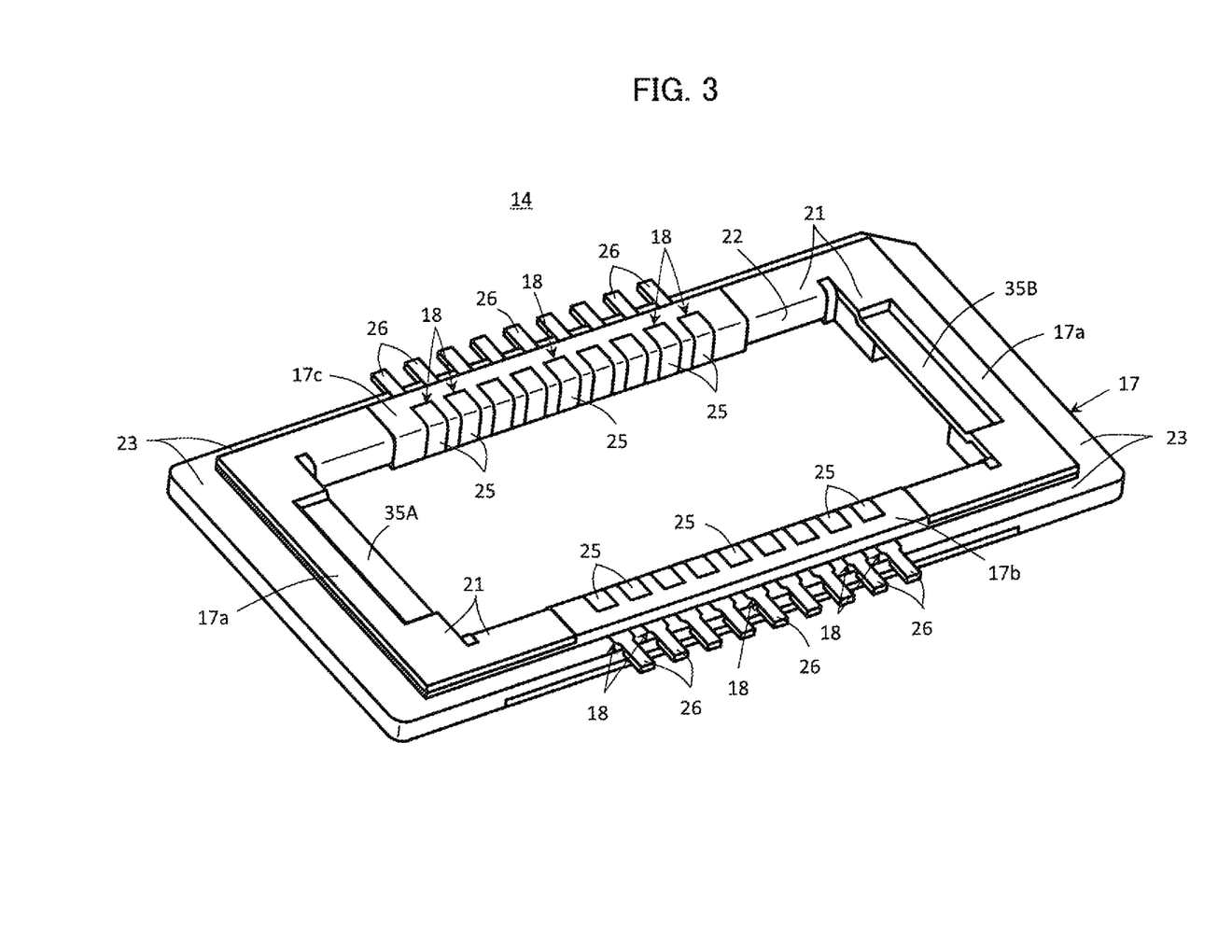
FIG. 3 is a schematic perspective view showing a stepped portion of the second connector shown in FIG. 1, which is provided for engaging with an engaging hole formed in the flat circuit member shown in FIG. 2.

FIG. 3 shows the lower side of the second connector 14. Referring to FIG. 3, in the insulating housing 17 of the second connector 14, the annular outside edge portion 23 surrounding the annular engaging portion 21 in which the hole 22 is formed shapes an annular stepped portion to the annular engaging portion 21. When the second connector 14 is attached to the flat circuit member 13, the annular stepped portion shaped on the annular outside edge portion 23 of the insulating housing 17 of the second connector 14 is caused to engage with the annular hole-forming portion 13a of the flat circuit member 13 so that the annular engaging portion 21 in which the hole 22 is formed is put in the engaging hole 19 formed in the annular hole-forming portion 13a and the annular outside edge portion 23 is caused to face a portion of the flat surface 13b of the flat circuit member 13 surrounding the engaging hole 19. As a result, the annular engaging portion 21 of the insulating housing 17 of the second connector 14, in which the hole 22 is formed, is caused to fit into the engaging hole 19 formed in the annular hole-forming portion 13a of the flat circuit member 13 so that the insulating housing 17 of the second connector 14 is fixed to the annular hole-forming portion 13a of the flat circuit member 13 with the annular engaging portion 21 thereof fitting into the engaging hole 19.

As shown in FIGS. 2 and 3, a metallic reinforcing member 17a is provided on the insulating housing 17 of the second connector 14 by means of insert molding so as to cover partially an outer surface of the insulating housing 17. Further, the contacts 18 are arranged in a longitudinal direction of the second connector 14 on each of a pair of longitudinal side portions 17b and 17c of the insulating housing 17 formed into the flat rectangular frame, which extend in parallel to face each other with the hole 22 between. Each of the contacts 18 has a contact-connecting portion 25 positioned to face to the hole 22 and a terminal-connecting portion 26 extending from an outer side surface of the insulating housing 17 to the outside of the same. As shown in FIG. 1, the contact-connecting portion 25 of each of the contacts 18 is put on an inner wall surface of the annular engaging portion 21 forming the hole 22 and the terminal-connecting portion 26 of each of the contacts 18 is connected with a corresponding one of the circuit-terminals 20 arranged on the flat surface 13b of the flat circuit member 13 to be positioned in the vicinity of the engaging hole 19 formed in the annular hole-forming portion 13a of the flat circuit member 13 when the second connector 14 is attached to the flat circuit member 13.

The insulating housing 15 of the first connector 12 shown in FIG. 1 is formed into a flat rectangular frame forming a rectangular opening 27 and having a pair of longitudinal side portions 15a and 15b extending in parallel to face each other with the rectangular opening 27 between and a pair of transversal side portions 15d and 15e extending in parallel to face each other with the rectangular opening 27 between. On each of the longitudinal side portions 15a and 15b of the insulating housing 15 formed into the flat rectangular frame, a plurality of contacts 16 are arranged in a longitudinal direction of the first connector 12. Each of the contacts 16 has a board-connecting portion 28 operative to be connected with a corresponding one of circuit-terminals provided on the main circuit board 11 in the rectangular opening 27 formed in the insulating housing 15 and a contact-engaging portion 29 extending from an outer side surface 15c of the insulating housing 15 to the outside of the same.

The first connector 12 is provided also with a pair of metallic holding members 30A and 30B to be used for attaching the insulating housing 15 to the main circuit board 11. The metallic holding members 30A is caused to engage with the transversal side portion 15d of the insulating housing 15 from the outside thereof for holding the insulating housing 15 and the metallic holding members 30B is caused to engage with the transversal side portion 15e of the insulating housing 15 from the outside thereof for holding the insulating housing 15. The metallic holding members 30A is fixed to the main circuit board 11 with a board-connecting portion 31A thereof soldered to a soldering portion provided on the main circuit board 11. Similarly, the metallic holding members 30B is also fixed to the main circuit board 11 with a board-connecting portion 31B thereof soldered to a soldering portion provided on the main circuit board 11.

Further, the metallic holding members 30A is made of resilient metallic plate subjected to punching and bending process to have a resilient folded portion 32A positioned at the outside of the transversal side portion 15d of the insulating housing 15. The resilient folded portion 32A of the metallic holding members 30A is provided with a pair of locking projections 33A, each of which projects from the resilient folded portion 32A to the outside of the same for locking the second connector 14. Similarly, the metallic holding members 30B is made of resilient metallic plate subjected to punching and bending process to have a resilient folded portion 32B positioned at the outside of the transversal side portion 15e of the insulating housing 15. The resilient folded portion 32B of the metallic holding members 30B is provided with a pair of locking projections 33B, each of which projects from the resilient folded portion 32B to the outside of the same for locking the second connector 14.

Figure 4:
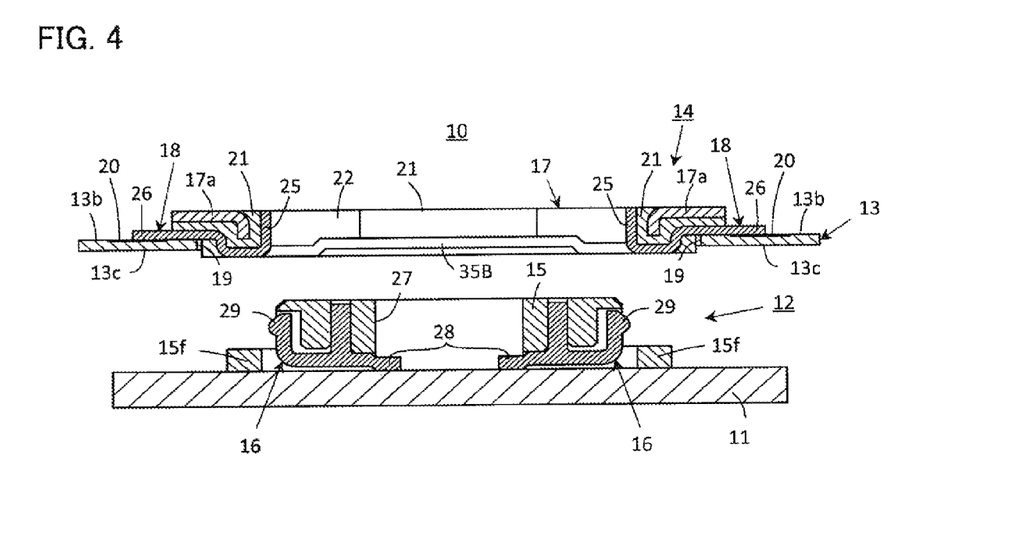
FIG. 4 is a schematic cross sectional view showing the first and second connectors shown in FIG. 1 and positioned to face each other just before the second connector is coupled with the first connector.

When the second connector 14 attached to the flat circuit member 13 is coupled with the first connector 12 fixed on the main circuit board 11, first, as shown in FIG. 4, the second connector 14 accompanied with the flat circuit member 13 is caused to face the main circuit board 11 in such a manner that the annular engaging portion 21 of the insulating housing 17 of the second connector 14, in which the hole 22 is formed, is positioned to correspond to the insulating housing 15 of the first connector 12 fixed to the main circuit board 11. At that time, the flat surface 13c of the flat circuit member 13 opposite to the flat surface 13b of the flat circuit member 13 on which the circuit-terminals 20 are provided is face the main circuit board 11.

Figure 5:
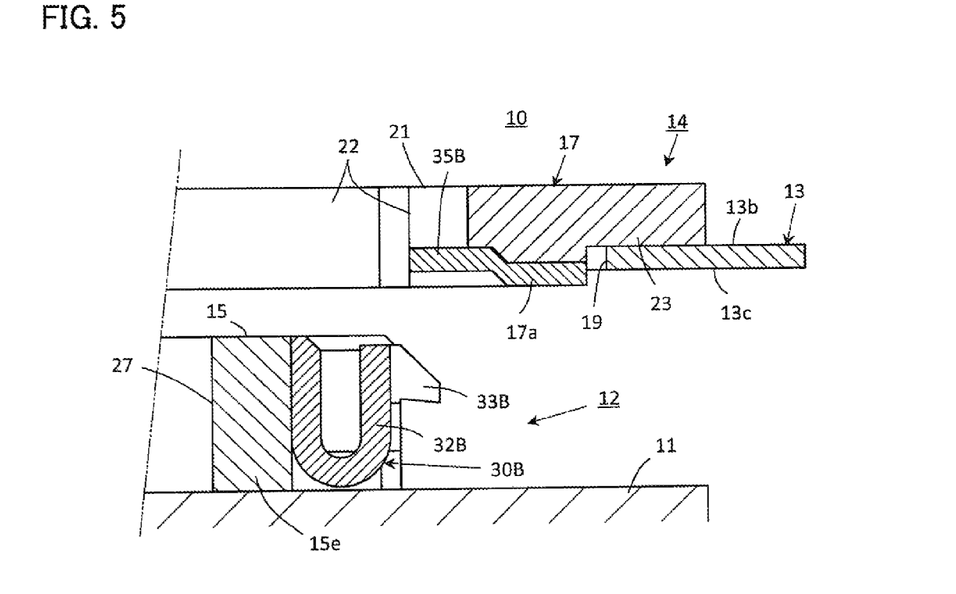
FIG. 5 is a schematic partial cross sectional view showing a part of each of the first and second connectors shown in FIG. 1 and positioned to face each other just before the second connector is coupled with the first connector.

As shown in FIG. 5, a receiving portion 35B which is formed in the metallic reinforcing member 17a provided on the insulating housing 17 of the second connector 14 for constituting a portion of the annular engaging portion 21 of the insulating housing 17 in which the hole 22 is formed, is positioned in the vicinity of the hole 22 to correspond to the locking projections 33B projecting from the resilient folded portion 32B of the metallic holding members 30B to be positioned at the outside of the transversal side portion 15e of the insulating housing 15 of the first connector 12. Similarly, another receiving portion 35A which is formed in the metallic reinforcing member 17a provided on the insulating housing 17 of the second connector 14 for constituting a portion of the annular engaging portion 21 of the insulating housing 17 in which the hole 22 is formed, is positioned in the vicinity of the hole 22 to correspond to the locking projections 33A projecting from the resilient folded portion 32A of the metallic holding members 30A to be positioned at the outside of the transversal side portion 15d of the insulating housing 15 of the first connector 12.

Then, the flat circuit member 13 having the flat surface 13c which is opposite to the flat surface 13b provided thereon with the circuit-terminals 20 and faces the main circuit board 11, is caused to approach closely to the main circuit board 11 so that the insulating housing 15 of the first connector 12 fixed to the main circuit board 11 fits into the hole 22 formed in the annular engaging portion 21 of the insulating housing 17 of the second connector 14 attached to the flat circuit member 13 and the flat circuit member 13 is laid on top of the main circuit board 11. Thereby, the main circuit board 11 and the flat circuit member 13 are put in electrical piling connection wherein the flat circuit member 13 is electrically connected with the main circuit board 11, as shown in FIG. 6.

Figure 6:
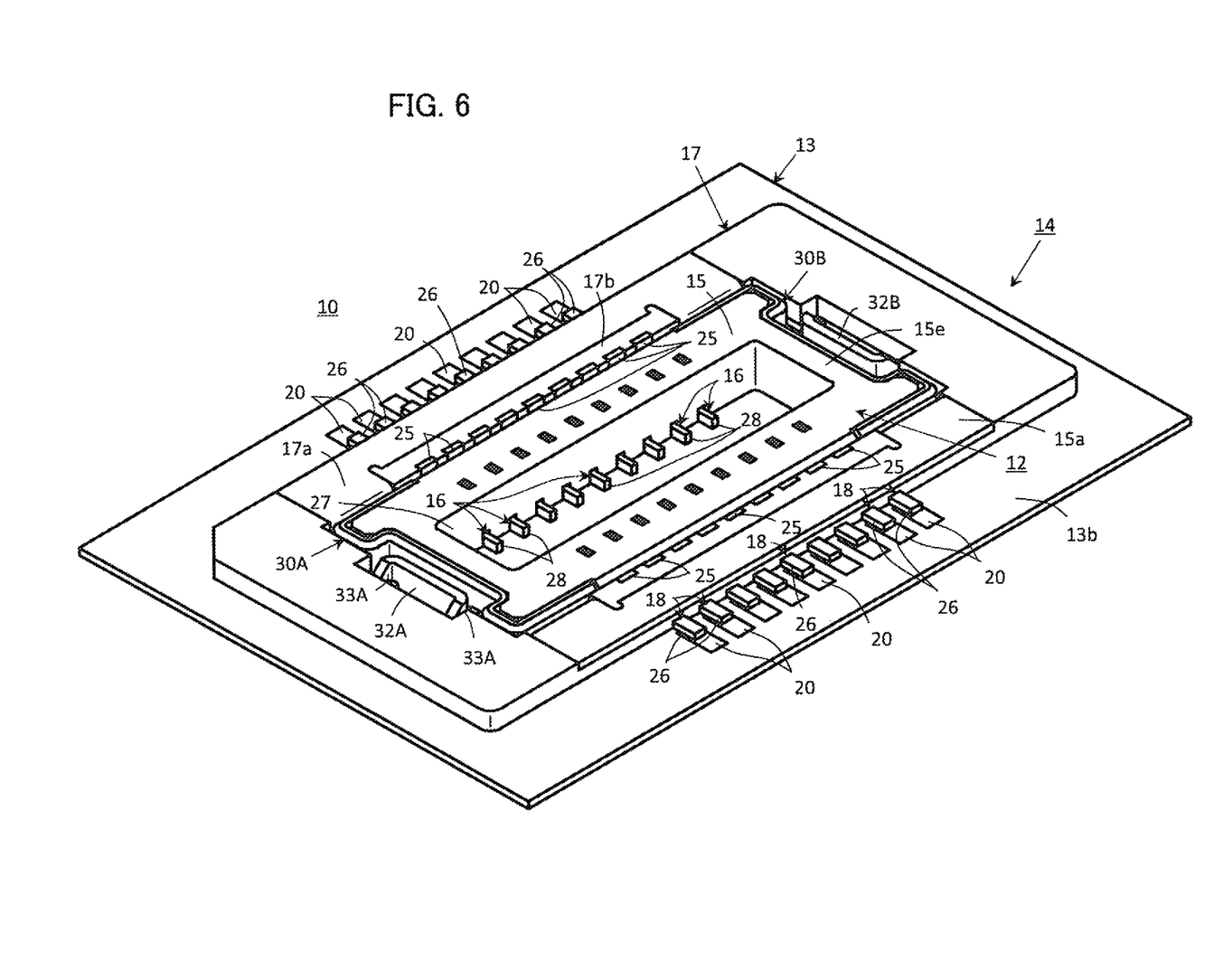
FIG. 6 is a schematic perspective view showing the first and second connectors shown in FIG. 1 and put in a condition wherein the second connector is coupled with the first connector.
Figure 7:
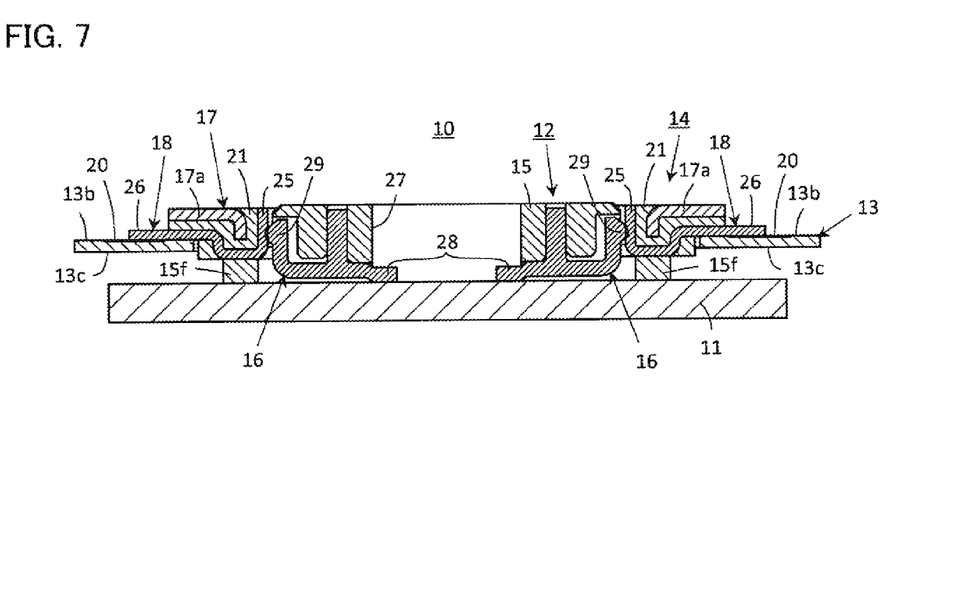
FIG. 7 is a schematic cross sectional view showing the first and second connectors shown in FIG. 1 and put in the condition wherein the second connector is coupled with the first connector.

In the electrical piling connection between the main circuit board 11 and the flat circuit member 13 established as shown in FIG. 6, the insulating housing 17 of the second connector 14 comes into contact with projecting flat portions 15f of the insulating housing 15 of the first connector 12, each of which is put on the main circuit board 11, so that the second connector 14 of the whole is supported by the projecting flat portions 15*f* of the insulating housing 15 on the main circuit board 11 and the flat surface 13*c* of the flat circuit member 13 is maintained to face the main circuit board 11, as shown in FIG. 7. The contact-connecting portion 25 of each of the contacts 18 supported by the insulating housing 17 of the second connector 14, which is positioned to face to the hole 22 formed in the annular engaging portion 21 of the insulating housing 17, comes into contact with the contact-engaging portion 29 of one of the contacts 16 supported by the insulating housing 15 of the first connector 12, which extends from the outer side surface 15*c* of the insulating housing 15 to the outside thereof, to be connected electrically with the same. Thereby, the circuit-terminals 20 provided on the flat circuit member 13, with each of which the terminal-connecting portion 26 of the contact 18 is connected, are connected through the contacts 18 and 16 respectively with the circuit-terminals provided on the main circuit board 11, with each of which the board-connecting portion of the contact 16 is connected.

Figure 8:
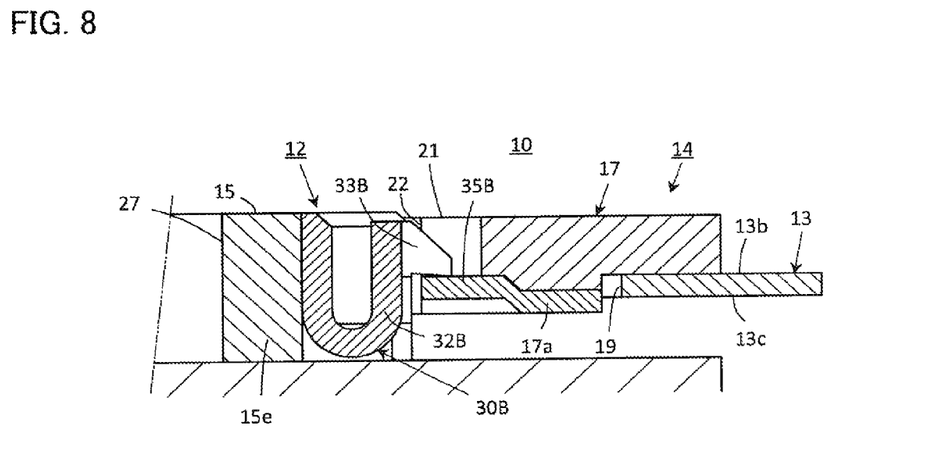
FIG. 8 is a schematic partial cross sectional view showing a part of each of the first and second connectors shown in FIG. 1 and put in the condition wherein the second connector is coupled with the first connector.

Further, as shown in FIG. 8, the locking projections 33B projecting from the resilient folded portion 32B of the metallic holding members 30B put in the hole 22 formed in the annular engaging portion 21 of the insulating housing 17 of the second connector 14 to the outside of the resilient folded portion 32B is operative to engage with the receiving portion 35B formed in the metallic reinforcing member 17*a* provided on the insulating housing 17 of the second connector 14 for locking the second connector 14. Similarly, the locking projections 33A projecting from the resilient folded portion 32A of the metallic holding members 30A put in the hole 22 formed in the annular engaging portion 21 of the insulating housing 17 of the second connector 14 to the outside of the resilient folded portion 32A is operative to engage with the receiving portion 35A formed in the metallic reinforcing member 17*a* provided on the insulating housing 17 of the second connector 14 for locking the second connector 14. In such a manner as mentioned above, the second connector 14 attached to the flat circuit member 13, which is connected electrically with the main circuit board 11 by means of the electrical piling connection between the main circuit board 11 and the flat circuit member 13, is locked by the locking projections 33A and 33B provided on the first connector 12 and thereby the electrical piling connection between the main circuit board 11 and the flat circuit member 13 is surely maintained to be stable.

With the above-explained circuit-terminal connecting device 10 comprising the first connector 12 provided on the main circuit board 11 and the second connector 14 accompanied with the flat circuit member 13, since the electrical piling connection between the main circuit board 11 and the flat circuit member 13, such as the FPC, wherein the circuit-terminals provided on the main circuit board 11 are electrically connected respectively with the circuit-terminals 20 provided on the flat circuit member 13 is created by causing the insulating housing 15 of the first connector 12 fixed to the main circuit board 11 to fit into the hole 22 formed in the annular engaging portion 21 of the insulating housing 17 of the second connector 14 attached to the flat circuit member 13, a thickness of a structure on the whole including the main circuit board 11 to which the insulating housing 15 of the first connector 12 is fixed and the flat circuit member 13 on which the insulating housing 17 of the second connector 14 is placed and which is laid on top of the main circuit board 11 can be effectively reduced.

Further, since the insulating housing 15 of the first connector 12 fixed to the main circuit board 11 is able to be visually observed through the engaging hole 19 formed in the hole-forming portion 13*a* of the flat circuit member 13 and the hole 22 formed in the annular engaging portion 21 of the insulating housing 17 of the second connector 14 when the flat circuit member 13 is caused to face the main circuit board 11 for coming close to the same so as to create the electrical piling connection between the main circuit board 11 and the flat circuit member 13 wherein the circuit-terminals provided on the main circuit board 11 are electrically connected respectively with the circuit-terminals 20 provided on the flat circuit member 13, the insulating housing 15 of the first connector 12 can be caused to fit into the hole 22 formed in the annular engaging portion 21 of the insulating housing 17 of the second connector 14 with the direct visual observation on both of the insulating housing 15 of the first connector 12 fixed to the main circuit board 11 and the hole 22 formed in the annular engaging portion 21 of the insulating housing 17 of the second connector 14. As a result, the electrical piling connection between the main circuit board 11 and the flat circuit member 13 can be surely created by a handling operation superior in practice and, in addition, a condition wherein the main circuit board 11 and the flat circuit member 13 are surely put in the electrical piling connection can be confirmed easily and visually.

Besides, since the locking projections 33A and 33B of the first connector 12 are operative to project from the hole 22 formed in the annular engaging portion 21 of the insulating housing 17 of the second connector 14 so as to engage respectively with the receiving portions 35A and 35B formed on the annular engaging portion 21 of the insulating housing 17 of the second connector 14 and thereby to lock the second connector 14 when the insulating housing 15 of the first connector 12 fixed to the main circuit board 11 is caused to fit into the hole 22 formed in the annular engaging portion 21 of the insulating housing 17 of the second connector 14, the electrical piling connection between the main circuit board 11 and the flat circuit member 13 can be surely maintained to be stable.

Figure 9:
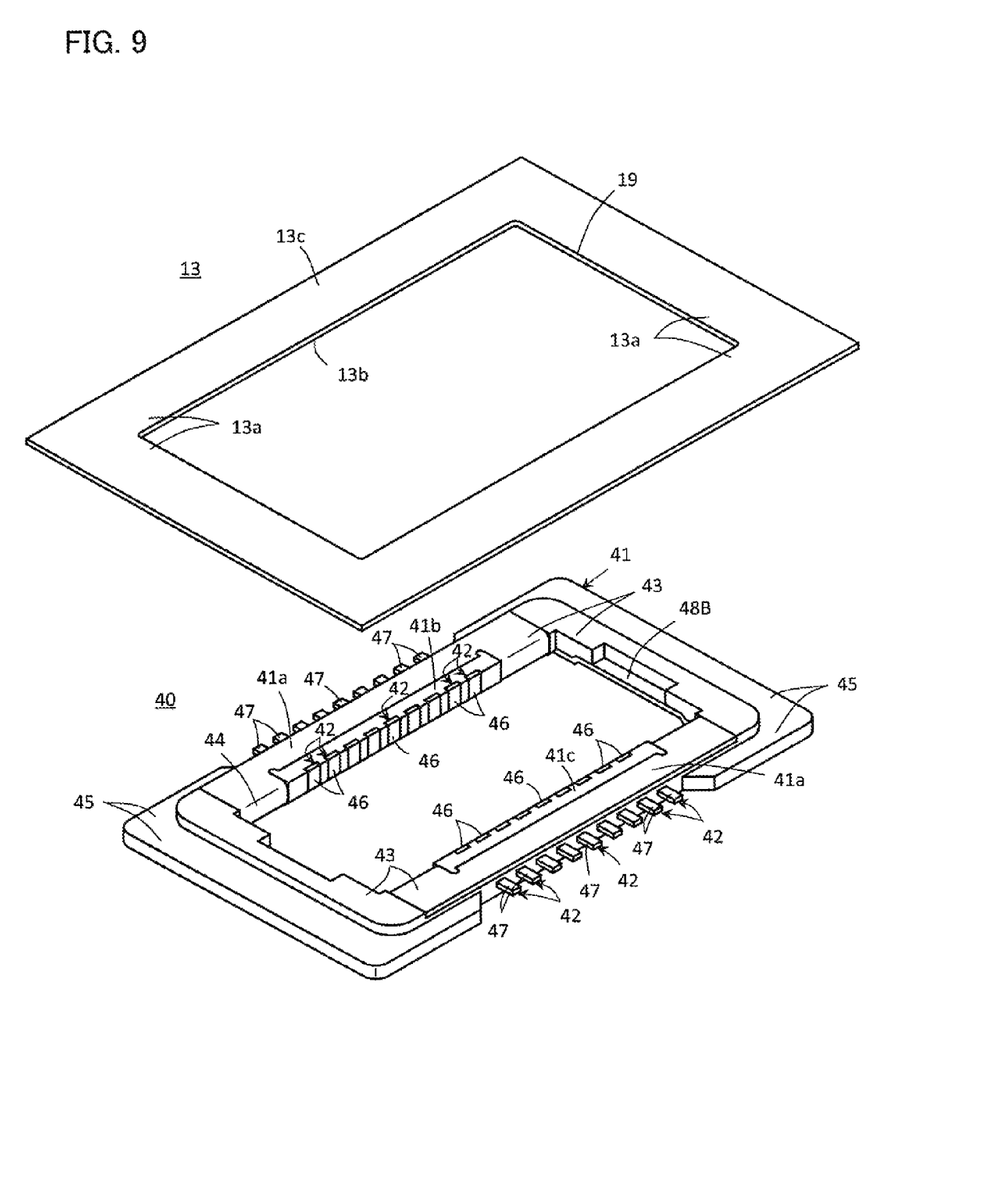
FIG. 9 is a schematic perspective view showing the flat circuit member shown in FIG. 1 and another second connector composing, together with the first connector shown in FIG. 1, a second embodiment of circuit-terminal connecting device according to the present invention.

FIG. 9 shows another second connector which composes, together with the first connector 12 shown in FIG. 1, a second embodiment of circuit-terminal connecting device according to the present invention and is removed from the flat circuit member 13 shown in FIGS. 1 and 2.

Figure 10:
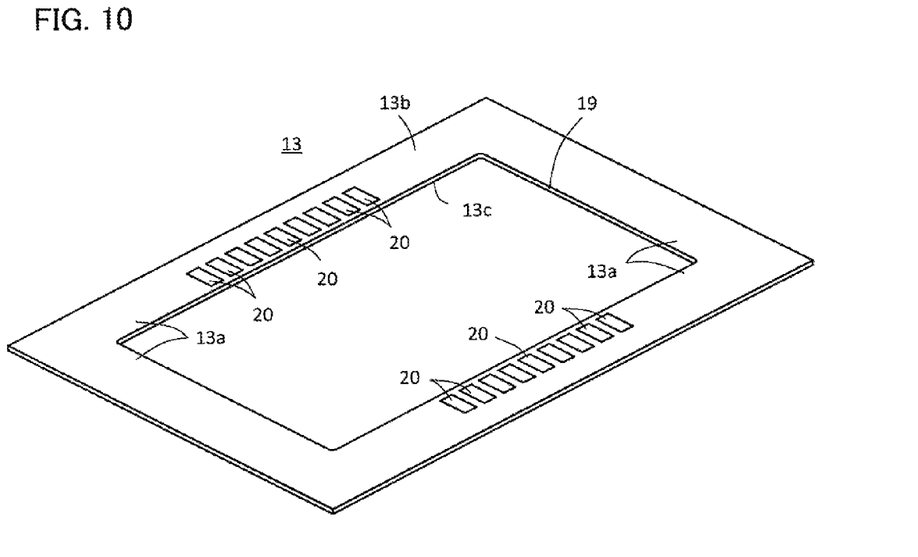
FIG. 10 is a schematic perspective view showing one of a pair of surfaces opposite to each other of the flat circuit member shown in FIG. 1, on which a plurality of circuit-terminals are provided.

Referring to FIG. 9, a second connector 40 composing a circuit-terminal connecting device 50 (shown in FIG. 12), which constitutes the second embodiment of circuit-terminal connecting device according to the present invention, is provided to be fixed to the flat circuit member 13. In FIG. 9, the flat surface 13*c* of the flat circuit member 13 is laid to be upward. As shown in FIG. 10, the circuit-terminals 20 are arranged on the flat surface 13*b* of the flat circuit member 13 opposite to the flat surface 13*c* to be positioned in the vicinity of the engaging hole 19 formed in the annular hole-forming portion 13*a* of the flat circuit member 13.

When the second connector 40 shown in FIG. 9 is put in practical use, the second connector 40 is accompanied with the flat circuit member 13 and coupled with the first connector 12 provided on the main circuit board 11 as shown in FIG. 1, so as to compose the circuit-terminal connecting device 50 constituting the second embodiment of circuit-terminal connecting device according to the present invention.

In FIG. 9, the second connector 40 has an insulating housing 41 and a plurality of contacts 42 supported by the insulating housing 41.

The insulating housing 41 of the second connector 40 is provided with an annular engaging portion 43 for engaging with the first connector 12 having the insulating housing 15 fixed to the main circuit board 11. In the annular engaging portion 43 of the insulating housing 41 of the second connector 40, a hole 44 is formed so that the insulating housing 15 of the first connector 12 fits into the hole 44 when the second connector 40 is coupled with the first connector 12. Therefore, the insulating housing 41 of the second connector 40 is formed into a flat rectangular frame having at an inner side thereof the annular engaging portion 43 and at an outer side thereof an annular outside edge portion 45 surrounding the annular engaging portion 43.

For the sake of convenience, hereinafter, the upper side of figures shown in FIG. 9 is referred to as an upper side in relation to the second connector 40 and the lower side of figures shown in FIG. 9 is referred to as a lower side in relation to the second connector 40.

Referring to the upper side of the second connector 40 shown in FIG. 9, in the insulating housing 41 of the second connector 40, the annular outside edge portion 45 surrounding the annular engaging portion 43 in which the hole 44 is formed is shaped into an annular stepped portion to the annular engaging portion 43. When the second connector 40 is attached to the flat circuit member 13, the annular stepped portion shaped on the annular outside edge portion 45 of the insulating housing 41 of the second connector 40 is caused to engage with the annular hole-forming portion 13a of the flat circuit member 13 so that the annular engaging portion 43 in which the hole 44 is formed is put in the engaging hole 19 formed in the annular hole-forming portion 13a of the flat circuit member 13 and the annular outside edge portion 45 is caused to face a portion of the flat surface 13b of the flat circuit member 13 surrounding the engaging hole 19. As a result, the annular engaging portion 43 of the insulating housing 41 of the second connector 40, in which the hole 44 is formed, is caused to fit into the engaging hole 19 formed in the annular hole-forming portion 13a of the flat circuit member 13 so that the insulating housing 41 of the second connector 40 is fixed to the annular hole-forming portion 13a of the flat circuit member 13 with the annular engaging portion 43 thereof fitting into the engaging hole 19.

Figure 11:
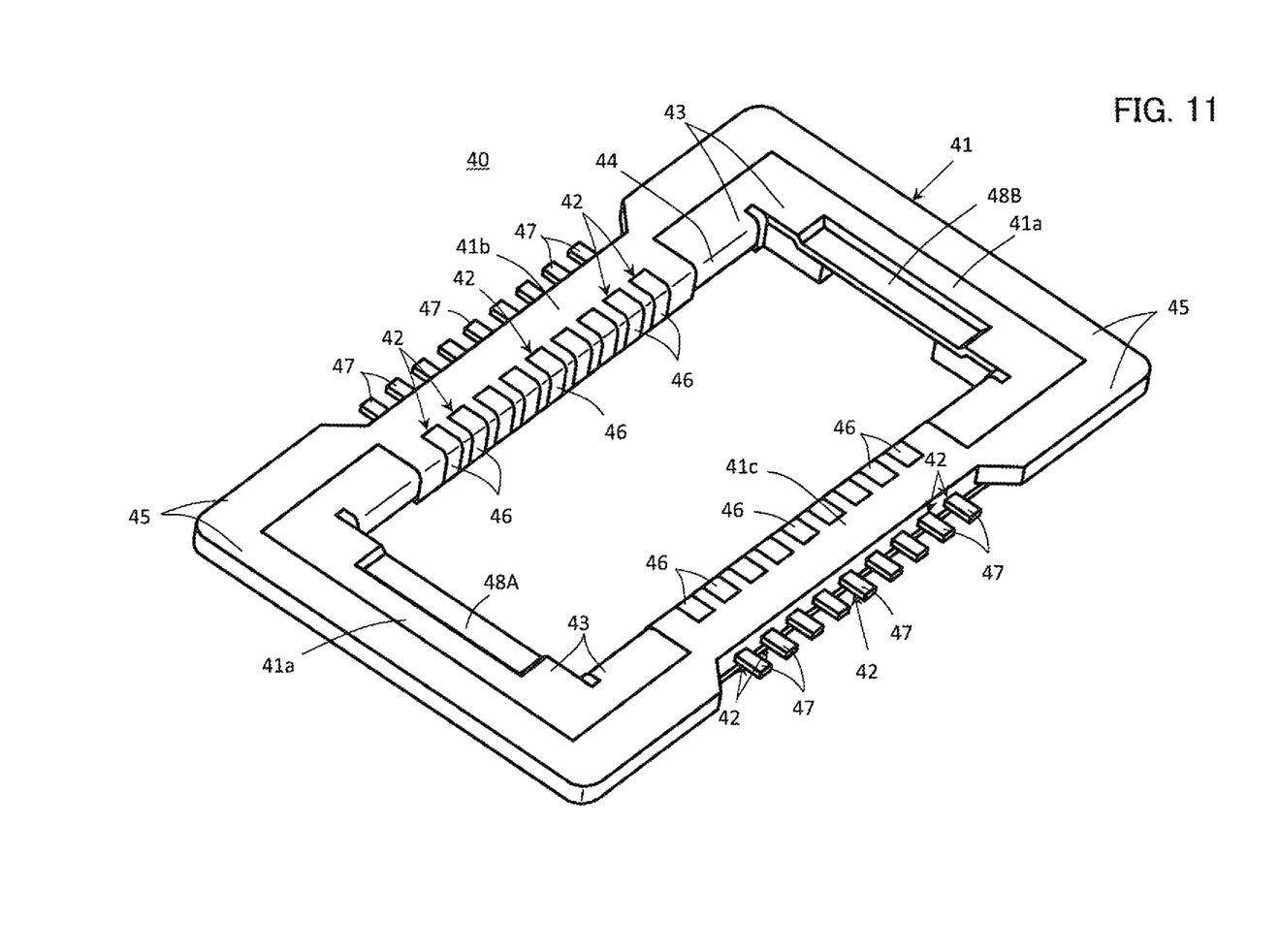
FIG. 11 is a schematic perspective view showing a portion of the second connector shown in FIG. 9, which is provided for facing the main circuit board on which the insulating housing of the first connector shown in FIG. 1 is fixed.

FIG. 11 shows the lower side of the second connector 40. Referring to FIG. 11, in the lower side of the second connector 40, the annular engaging portion 43 of the insulating housing 41, in which the hole 44 is formed, and the annular outside edge portion 45 of the insulating housing 41, which surrounds the annular engaging portion 43, are provided with respective outer surfaces forming substantially a single plane without differences in level thereon.

As shown in FIGS. 9 and 11, a metallic reinforcing member 41a is provided on the insulating housing 41 of the second connector 40 by means of insert molding so as to cover partially an outer surface of the insulating housing 41. Further, the contacts 42 are arranged in a longitudinal direction of the second connector 40 on each of a pair of longitudinal side portions 41b and 41c of the insulating housing 41 formed into the flat rectangular frame, which extend in parallel to face each other with the hole 44 between. Each of the contacts 42 has a contact-connecting portion 46 positioned to face to the hole 44 and a terminal-connecting portion 47 extending from an outer side surface of the insulating housing 41 to the outside of the same. The terminal-connecting portion 47 of each of the contacts 42 is connected with a corresponding one of the circuit-terminals 20 arranged on the flat surface 13b of the flat circuit member 13 to be positioned in the vicinity of the engaging hole 19 formed in the annular hole-forming portion 13a of the flat circuit member 13 when the second connector 40 is attached to the flat circuit member 13.

Figure 12:
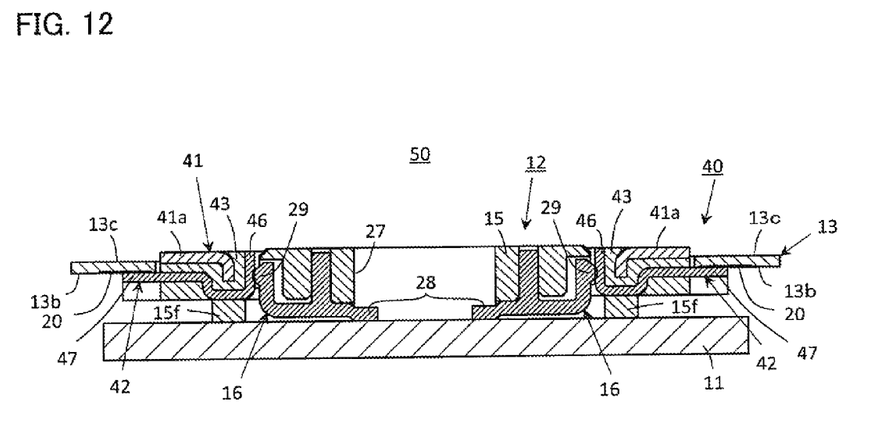
FIG. 12 is a schematic cross sectional view showing the first connector shown in FIG. 1 and the second connector shown in FIG. 9, which are put in a condition wherein the second connector is coupled with the first connector.

When the second connector 40 attached to the flat circuit member 13 is coupled with the first connector 12 fixed on the main circuit board 11 so that the circuit-terminal connecting device 50 constituting the second embodiment of circuit-terminal connecting device according to the present invention is constituted as shown in FIG. 12, first, the second connector 40 accompanied with the flat circuit member 13 is caused to face the main circuit board 11 in such a manner that the annular engaging portion 43 of the insulating housing 41 of the second connector 40, in which the hole 44 is formed, is positioned to correspond to the insulating housing 15 of the first connector 12 fixed to the main circuit board 11. At that time, the flat surface 13b of the flat circuit member 13 on which the circuit-terminals 20 are provided is face the main circuit board 11.

Then, the flat circuit member 13 with the flat surface 13c facing the main circuit board 11 is caused to approach closely to the main circuit board 11 so that the insulating housing 15 of the first connector 12 fixed to the main circuit board 11 fits into the hole 44 formed in the annular engaging portion 43 of the insulating housing 41 of the second connector 40 attached to the flat circuit member 13 and the flat circuit member 13 is laid on top of the main circuit board 11. Thereby, the main circuit board 11 and the flat circuit member 13 are put in electrical piling connection wherein the flat circuit member 13 is electrically connected with the main circuit board 11.

In the electrical piling connection between the main circuit board 11 and the flat circuit member 13 thus created as shown in FIG. 12, the insulating housing 41 of the second connector 40 comes into contact with projecting flat portions 15f of the insulating housing 15 of the first connector 12, each of which is put on the main circuit board 11, so that the second connector 40 of the whole is supported by the projecting flat portions 15f of the insulating housing 15 on the main circuit board 11 and the flat surface 13c of the flat circuit member 13 is maintained to face the main circuit board 11, as shown in FIG. 12. The contact-connecting portion 46 of each of the contacts 42 supported by the insulating housing 41 of the second connector 40, which is positioned to face to the hole 44 formed in the annular engaging portion 43 of the insulating housing 41, comes into contact with the contact-engaging portion 29 of one of the contacts 16 supported by the insulating housing 15 of the first connector 12, which extends from the outer side surface 15c of the insulating housing 15 to the outside thereof, to be connected electrically with the same. Thereby, the circuit-terminals 20 provided on the flat circuit member 13, with each of which the terminal-connecting portion 47 of the contact 42 is connected, are connected through the contacts 42 and 16 respectively with the circuit-terminals provided on the main circuit board 11, with each of which the board-connecting portion of the contact 16 is connected.

Further, although illustrations are omitted, the locking projections 33B projecting from the resilient folded portion 32B of the metallic holding members 30B put in the hole 44 formed in the annular engaging portion 43 of the insulating housing 41 of the second connector 40 to the outside of the resilient folded portion 32B is operative to engage with a receiving portion 48B formed in the metallic reinforcing member 41a provided on the insulating housing 41 of the second connector 40 for locking the second connector 40. Similarly, the locking projections 33A projecting from the resilient folded portion 32A of the metallic holding members 30A put in the hole 44 formed in the annular engaging portion 43 of the insulating housing 41 of the second connector 40 to the outside of the resilient folded portion 32A is operative to engage with a receiving portion 48A formed in the metallic reinforcing member 41a provided on the insulating housing 41 of the second connector 40 for locking the second connector 40. In such a manner as mentioned above, the second connector 40 attached to the flat circuit member 13, which is connected electrically with the main circuit board 11 by means of the electrical piling connection between the main circuit board 11 and the flat circuit member 13, is locked by the locking projections 33A and 33B provided on the first connector 12 and thereby the electrical piling connection between the main circuit board 11 and the flat circuit member 13 is surely maintained to be stable.

With the above-explained circuit-terminal connecting device 50 comprising the first connector 12 provided on the main circuit board 11 and the second connector 40 accompanied with the flat circuit member 13, functions and effects which are the same as those obtained in the aforementioned circuit-terminal connecting device 10 is also obtained.

The invention claimed is:

1. A circuit-terminal connecting device comprising;
a first connector having a first insulating housing fixed to a main circuit board and a plurality of first contacts, each of said first contacts being supported by the first insulating housing to have a board-connecting portion operative to be connected with a corresponding one of first circuit-terminals provided on the main circuit board, and
a second connector having a second insulating housing attached to a flat circuit member and provided with an engaging portion for engaging with the first connector and a plurality of second contacts, each of said second contacts being supported by the second insulating housing to have a terminal-connecting portion operative to be connected with a corresponding one of second circuit-terminals provided on the flat circuit member,
wherein the first connector is provided with a locking projection operative to project from a portion of the first connector positioned in a hole formed in the second insulating housing of the second connector so as to engage with a receiving portion formed on a part of the engaging portion of the second insulating housing of the second connector and thereby to lock the second connector when the first insulating housing of the first connector fits into the hole formed in the second insulating housing of the second connector,
wherein the first connector is further provided with a metallic holding member to be used for attaching the first insulating housing of the first connector to the main circuit board and the locking projection is provided in the metallic holding member as a resilient portion,
wherein the second insulating housing of the second connector is fixed to a hole-forming portion of the flat circuit member with the engaging portion thereof fitting into an engaging hole formed in the hole-forming portion,
wherein the engaging portion of the second insulating housing of the second connector forms a hole therein into which the first insulating housing of the first connector fits,
wherein each of the first contacts of the first connector is provided with a contact-engaging portion extending from an outer surface of the first insulating housing of the first connector to the outside of the same,
wherein each of the second contacts of the second connector is provided with a contact-connecting portion positioned to face to the hole formed in the second insulating housing of the second connector, and,
wherein the contact-connecting portion of the second contact of the second connector comes into contact with the contact-engaging portion of the first contact of the first connector to be connected with the same, so that the first circuit-terminals provided on the main circuit board are connected respectively with the second circuit-terminals provided on the flat circuit member through the first and second contacts when the first insulating housing of the first connector fits into the hole formed in the second insulating housing of the second connector.

2. A circuit-terminal connecting device according to claim 1, wherein an outside edge portion of the second insulating housing is shaped into a stepped portion and the second insulating housing is operative to cause the stepped portion to engage with the hole-forming portion of the flat circuit member.

3. A circuit-terminal connecting device according to claim 1, wherein the second circuit-terminals provided on the flat circuit member are positioned in the vicinity of the engaging hole formed in the hole-forming portion of the flat circuit member and the terminal-connecting portion of each of the second contacts extends from an outer side surface of the second insulating housing to the outside of the same so as to be connected with a corresponding one of the second circuit-terminals.

4. A circuit-terminal connecting device according to claim 3, wherein the flat circuit member is provided with a pair of first and second flat surfaces opposite to each other, the second circuit-terminals are arranged on the first flat surface, and the second flat surface is caused to face the main circuit board when the first insulating housing of the first connector fits into the hole formed in the second insulating housing of the second connector.

5. A circuit-terminal connecting device according to claim 3, wherein the flat circuit member is provided with a pair of first and second flat surfaces opposite to each other, the second circuit-terminals are arranged on the first flat surface, and the first flat surface is caused to face the main circuit board when the first insulating housing of the first connector fits into the hole formed in the second insulating housing of the second connector.

6. A circuit-terminal connecting device according to claim 1, wherein the contact-connecting portions of each of the second contacts is put on an inner wall surface of the engaging portion of the second insulating housing forming the hole into which the first insulating housing of the first connector fits.

7. A circuit-terminal connecting device according to claim 1, wherein the receiving portion of the second insulating housing of the second connector is positioned in the vicinity of the hole formed in the second insulating housing of the second connector, into which the first insulating housing of the first connector fits.

* * * * *